US012615797B2

(12) United States Patent
Wang

(10) Patent No.: US 12,615,797 B2
(45) Date of Patent: Apr. 28, 2026

(54) SEMICONDUCTOR DEVICE AND METHOD FOR MANUFACTURING THE SAME

(71) Applicant: Silergy Semiconductor Technology (Hangzhou) LTD, Hangzhou (CN)

(72) Inventor: Huan Wang, Hangzhou (CN)

(73) Assignee: Silergy Semiconductor Technology (Hangzhou) LTD., Hangzhou (CN)

( * ) Notice: Subject to any disclaimer, the term of this patent is extended or adjusted under 35 U.S.C. 154(b) by 647 days.

(21) Appl. No.: 18/080,889

(22) Filed: Dec. 14, 2022

(65) Prior Publication Data

US 2023/0207690 A1 Jun. 29, 2023

(30) Foreign Application Priority Data

Dec. 28, 2021 (CN) .......................... 202111625736.4

(51) Int. Cl.
| | |
|---|---|
| *H10D 30/65* | (2025.01) |
| *H01L 21/285* | (2006.01) |
| *H10D 30/01* | (2025.01) |
| *H10D 62/13* | (2025.01) |
| *H10D 64/01* | (2025.01) |

(52) U.S. Cl.
CPC ......... *H10D 30/65* (2025.01); *H10D 30/0281* (2025.01); *H10D 62/157* (2025.01); *H10D 64/01* (2025.01); *H10D 64/0112* (2026.01)

(58) Field of Classification Search
CPC .... H10D 64/516; H10D 64/52; H10D 62/116; H10D 62/158; H10D 64/251; H10D 30/65; H10D 30/0281; H10D 62/157; H10D 64/01; H01L 21/28518
See application file for complete search history.

(56) References Cited

U.S. PATENT DOCUMENTS

| | | | | |
|---|---|---|---|---|
| 5,773,890 | A | * | 6/1998 | Uchiyama ......... H01L 23/53223 |
| | | | | 257/770 |
| 6,703,666 | B1 | * | 3/2004 | Huttemann ......... H01L 23/5228 |
| | | | | 257/E27.047 |
| 8,716,795 | B2 | | 5/2014 | You |
| 8,912,600 | B2 | | 12/2014 | You |
| 10,985,052 | B2 | | 4/2021 | Wang |
| 11,133,413 | B2 | | 9/2021 | Han |
| 11,251,276 | B2 | | 2/2022 | Wang et al. |
| 2003/0122195 | A1 | * | 7/2003 | Tada .................... H10D 30/603 |
| | | | | 257/E27.06 |

(Continued)

*Primary Examiner* — Galina G Yushina

(57) ABSTRACT

A semiconductor device can include: a semiconductor doped region; a patterned interlayer dielectric layer located on the semiconductor doped region; an electrode structure connected to the semiconductor doped region through opening holes of the interlayer dielectric layer; a patterned metal silicide layer located on the semiconductor doped region; where the electrode structure comprises a first conductive pillar and a second conductive pillar, the first conductive pillar is connected to the metal silicide layer, and the second conductive pillar is connected to an upper surface of the semiconductor doped region; and where the first conductive pillar and the second conductive pillar are not in contact with a heavily doped region in the semiconductor doped region, and the doping concentration of the semiconductor doped region is not greater than $10^{18}$ cm$^{-3}$.

11 Claims, 2 Drawing Sheets

200

(56)                    References Cited

U.S. PATENT DOCUMENTS

| | | | |
|---|---|---|---|
| 2008/0211028 A1* | 9/2008 | Suzuki ................. | H10D 89/811 |
| | | | 257/E21.409 |
| 2009/0008710 A1* | 1/2009 | Wei ........................ | H10D 30/65 |
| | | | 257/E29.256 |
| 2021/0036112 A1* | 2/2021 | Xu ........................ | H10D 30/603 |
| 2022/0271158 A1* | 8/2022 | Kocon ................... | H10D 62/82 |

* cited by examiner

SEMICONDUCTOR DEVICE AND METHOD FOR MANUFACTURING THE SAME

RELATED APPLICATIONS

This application claims the benefit of Chinese Patent Application No. 202111625736.4, filed on Dec. 28, 2021, which is incorporated herein by reference in its entirety.

FIELD OF THE INVENTION

The present invention generally relates to the field of semiconductor technology, and more particularly to semiconductor devices and methods of manufacturing the semiconductor devices.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads. Power switches can be semiconducting devices, including metal-oxide-semiconductor field-effect transistors (MOSFETs) and insulated gate bipolar transistors (IGBTs), among others. For example, laterally-diffused metal-oxide-semiconductor (LDMOS) devices are widely used in such on-off type regulators.

DETAILED DESCRIPTION

Figure 1:
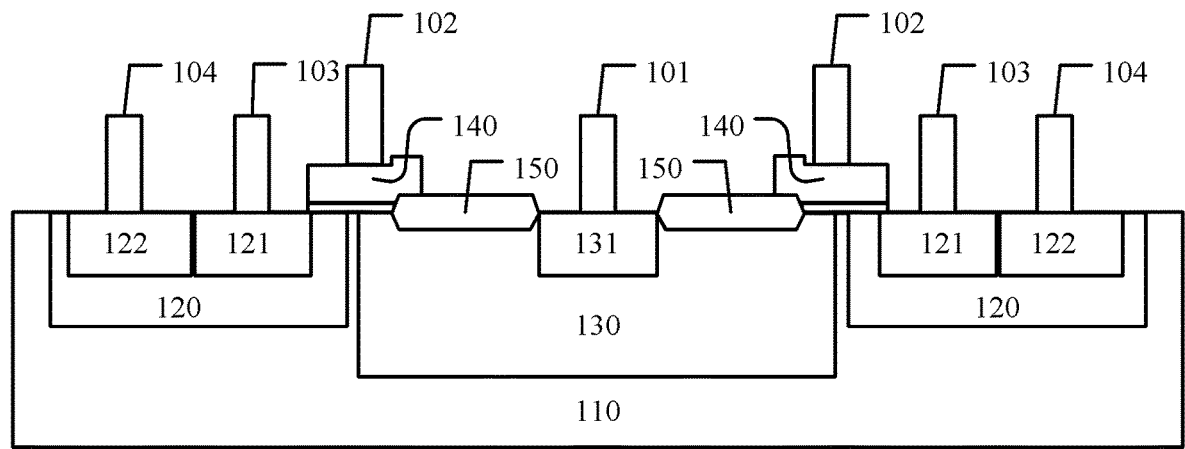
FIG. 1 is a structural diagram of an example semiconductor device.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor devices are generally manufactured using two complex manufacturing processes: front-end manufacturing and back-end manufacturing. Front-end manufacturing may involve the formation of a plurality of die on the surface of a semiconductor wafer. Each die on the wafer may contain active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components can be formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist may be removed, leaving behind a patterned layer. Alternatively, some types of materials can be patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface may be used to produce smaller and more densely packed active and passive components. Planarization can be used to remove material from the surface of the wafer and produce a uniformly flat surface. Planarization can involve polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer may be singulated using a laser cutting tool or saw blade. After singulation, the individual die are mounted to a package substrate that can include pins or contact pads for interconnection with other system components. Contact pads formed over the semiconductor die can then be connected to contact pads within the package. The electrical connections can be made with solder bumps, stud bumps, conductive paste, or wire bonds, as a few examples. An encapsulant or other molding material may be deposited over the package to provide physical support and electrical isolation. The finished package can then be inserted into an electrical system and the functionality of the semiconductor device is made available to the other system components.

Laterally-diffused metal-oxide-semiconductor (LDMOS) devices may have the following advantages: fast switching speed, able to meet application requirements of high breakdown voltage, able to withstand higher power than bipolar transistors, higher operating frequency, increased compatibility with Bi-CMOS bipolar integrated circuit process, and utility as a high-voltage unit of BCD circuit. As such, LDMOS transistors are widely used in drivers, high-frequency power amplifiers, and other applications. However, the LDMOS device structure extends in the horizontal direction, and its lateral size is relatively large, which takes up a large area of integrated circuits, which is counter to integrated circuit density improvements.

Referring now to FIG. 1, shown is a structural diagram of an example semiconductor device. In this particular example, semiconductor device 100 can include substrate 110, which can include drift region 130 and two body regions 120. Drift region 130 can be located between two body regions 120. Source doped region 121 and base region 122 may extend from an upper surface of body region 120 to the interior of body region 120. Source doped region 121 can be closer to drift region 130 than base region 122. Two gate structures 140, extending from over source doped region 121 to over drift region 130, can be arranged on substrate 110. Drain doped region 131 may extend from an upper surface of drift region 130 to the interior of drift region 120. Field oxide layer 150 can be arranged on drift region 130 between drain doped region 131 and a gate oxide layer of gate structure 140.

In particular embodiments, semiconductor device 100 can be led out for external connection through seven metal electrodes. Metal electrode 101 can connect to drain doped region 131 as a drain electrode. Two metal electrodes 102 can respectively connect to polysilicon layers of two gate structures 140 as gate electrodes. Two metal electrodes 103 can respectively connect to two source doped regions 121 as source electrodes. Two metal electrodes 104 can respectively connect to two base regions 122, and being led out to connect to the source electrode.

In particular embodiments, semiconductor device 100 can include two LDMOS structures, and the two LDMOS structures may share a drain end. The drain end can be configured to form a drain doped region 131 that is heavily doped in drift region 130. The electrical performance can be improved through drain doped region 131, in order to reduce ohmic contact resistance of the drain electrodes. Here, substrate 110, drift region 130, and source doped region 121 are a first doped type, and body region 120 and base region 122 are a second doped type. The first doped type is one of N-type doped and P-type doped, and the second doped is the other of N-type doped and P-type doped. In particular embodiments, substrate 110 is N-type doped, drift region 130 is N-type doped, body region 120 is P-type doped, source doped region 121 is N-type doped, and base region 122 is P-type doped.

Figure 2:
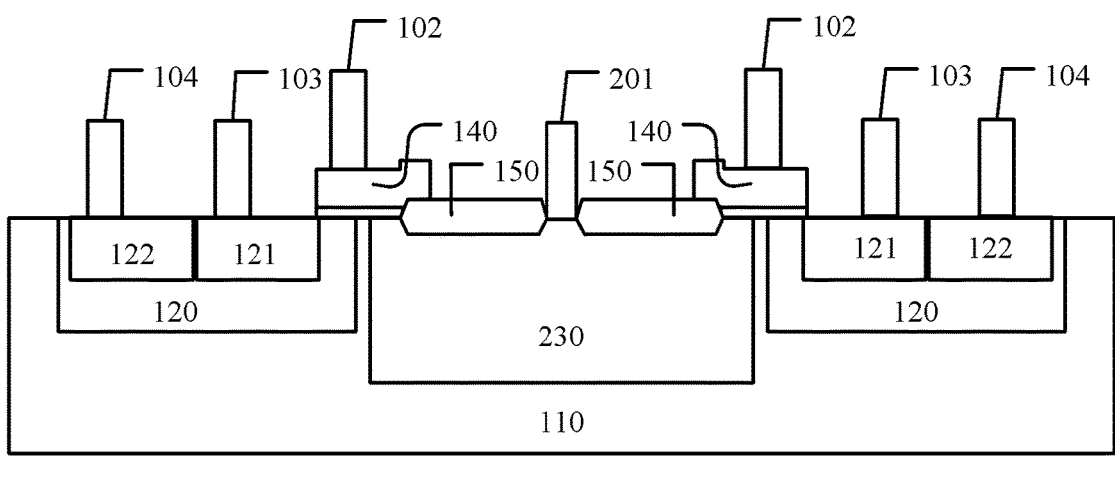
FIG. 2 is a structural diagram of an example semiconductor device, in accordance with embodiments of the present invention.
Figure 3:
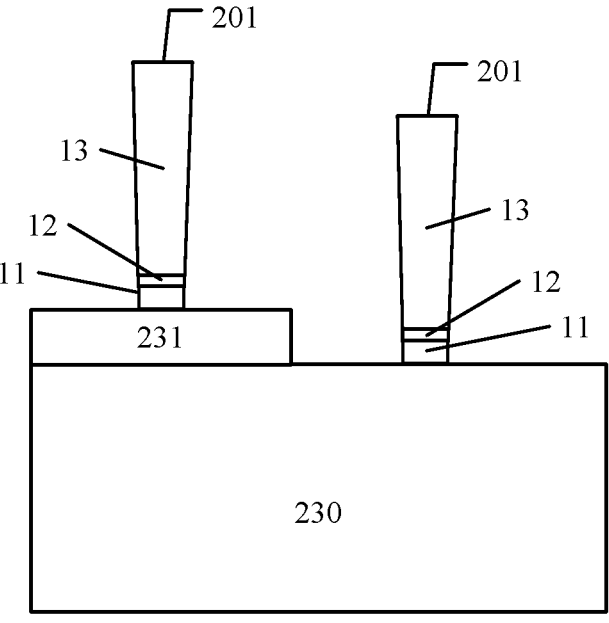
FIG. 3 is a partial structural diagram of the example semiconductor device, in accordance with embodiments of the present invention.

Referring now to FIG. 2, shown is a structural diagram of an example semiconductor device, in accordance with embodiments of the present invention. Referring also to FIG. 3, shown is a partial structural diagram of the example semiconductor device, in accordance with embodiments of the present invention. For example, the main structure of semiconductor device 200 shown in FIG. 2 is similar to that of semiconductor device 100 shown in FIG. 1, and the differences between the two will substantially be described below.

In particular embodiments, a semiconductor device can include: a semiconductor doped region; a patterned interlayer dielectric layer located on the semiconductor doped region; an electrode structure connected to the semiconductor doped region through opening holes of the interlayer dielectric layer, and a patterned metal silicide layer located on the semiconductor doped region. For example, the electrode structure can include a first conductive pillar and a second conductive pillar. The first conductive pillar can connect to the metal silicide layer, and the second conductive pillar can connect to the upper surface of the semiconductor doped region. Also, the first and second conductive pillars are not in contact with a heavily doped region in the semiconductor doped region, and the doping concentration of the semiconductor doped region is not greater than $10^{18}$ cm$^{-3}$. Further, the doping concentration of the semiconductor doped region is not greater than $10^{15}$ cm$^{-3}$.

In FIGS. 2 and 3, taking an LDMOS device as an example, the semiconductor doped region can be configured as the drift region. In particular embodiments, there may be no drain doped region (e.g., the heavily doped region) in drift region 230 of semiconductor device 200. An upper surface of the drift region 230 can include patterned metal silicide layer 231, and drain electrode 201 can include two conductive pillars. A first conductive pillar can connect to metal silicide layer 231, and a second pillar can connect to drift region 230. As such, when a drain doped region is not provided in drift region 230, the drain electrode of semiconductor device 200 can be ensured to be led out, and occupation of drain doped region on the lateral size of drift region 230 can be reduced, thereby the reducing the lateral size of semiconductor device 200.

The electrode structure of particular embodiments can also be set in the regions of other required electrodes or other devices, and two conductive pillars can be used to lead out the electrodes to omit the heavily doped region. The electrode structure may not only be used in the drain region in certain embodiments. In particular embodiments, the first and second conductive pillars may have a same structure, and both of which can include titanium layer 11, titanium nitride layer 12, and conductive column 13 being stacked in turn. A pad layer can include titanium layer 11 and titanium nitride layer 12. The metal of conductive column 13 can connect to the pad layer, and the pad layer can connect to metal silicide layer 231 and the silicon material of drift region 230. In this way, the reliability of the connection between the metal of conductive pillar 13 and drift region 230 can be ensured.

In particular embodiments, conductive pillar 13 can be a tungsten conductive pillar. A thickness of titanium layer 11 may be from 200 angstroms to 400 angstroms, which can ensure effective ohmic contact between the metal cushion and the drift zone 230, and also reduce the risk of cracking of the metal pad layer. A thickness of the titanium nitride layer 12 can be from 50 angstroms to 100 angstroms, which can ensure relatively small contact resistance between conductive pillar 13 and metal silicide layer 231.

In particular embodiments, the resistance of the first conductive pillar can be about 10 ohms, and the resistance of the second conductive pillar can be about 100 ohms. The first and second conductive pillars can connect in parallel after being led out. The change of the overall resistance as compared with the resistance of a single first conductive pillar may be about 10%, while the change of the overall resistance of semiconducting device 100 can be further reduced, which may have little impact on the performance of semiconductor device 100. That is, semiconductor device 100 of particular embodiments can effectively reduce the occupation demand of the drain doped region on the lateral size of semiconductor device 100, and also reduce the lateral size of semiconductor device 100, while the overall performance of semiconductor device 100 may be ensured and its integrated circuit performance may remain essentially unchanged.

The thickness of the titanium layer at the bottom of metal electrode 101 of the drain end of semiconductor device 100 shown in FIG. 1 can be from 100 to 200 angstroms, and the thickness of the titanium nitride layer can be from 50 to 200 angstroms. In particular embodiments, semiconductor device 200 can improve the thickness of the titanium layer at the bottom of the conductive pillar of the drain electrode, while reducing the thickness margin of the titanium nitride layer, which can ensure effective extraction of the drain electrode without the drain doped region, and the structural reliability of the metal pad layer. The structure of the first and second conductive pillars can be the same, in order to facilitate simultaneous forming according to the original conductive pillar manufacturing process, and also effectively control the process cost.

In particular embodiments, a manufacturing method of the semiconductor device can include: forming a semiconductor doped region in a semiconductor substrate; forming a patterned metal silicide layer located on part of the semiconductor doped region; forming interlayer dielectric layer located on the semiconductor doped region and the patterned metal silicide layer; etching the interlayer dielectric layer to form a first etching hole and a second etching hole, where the first etching hole is connected to the metal silicide layer, and the second etching hole is connected to the semiconductor doped region; forming an electrode structure connected to the semiconductor doped region through opening holes of the interlayer dielectric layer, and depositing conductive materials in the first etching hole and the second etching hole to form a drain electrode comprising a first conductive pillar and a second conductive pillar, where the first conductive pillar and the second conductive pillar are not in contact with a heavily doped region in the semiconductor doped region, and the doping concentration of the semiconductor doped region may not be greater than $10^{18}$ cm$^{-3}$. Further, the doping concentration of the semiconductor doped region may not be greater than $10^{15}$ cm$^{-3}$.

In an LDMOS device example, the semiconductor doped region can be configured as the drift region. A body region and a drift region may be formed on a semiconductor substrate. That is, the corresponding doped impurities can be doped on the upper surface of substrate 110, in order to obtain body region 120 and drift region 230. A source doped region may be formed in the body region. That is, the corresponding doped impurities may further be doped in body region 120, and source doped region 121 can be formed in body region 120. In some cases, base region 122 may also be formed in body region 120.

A gate structure can be formed between the source doped region and the drift region. Before forming the gate structure, field oxide layer 150 may also be formed on drift region 230, and two field oxide layers 150 can be arranged at intervals. Drain electrode 201 can be arranged in the area between the two field oxide layers 150. In particular embodiments, part of gate structure 140 may also be covered on field oxide layer 150. A metal silicide layer can be formed on the drift region. That is, the metal silicide layer can be deposited on the surface of drift region 230 between two field oxide layers 150, in order to form metal silicide layer 231.

An interlayer dielectric layer may be deposited on the semiconductor substrate. For example, the interlayer dielectric layer (ILD) can be silicon dioxide, which may cover substrate 110, body region 120, source doped region 121, base region 122, drift region 230, and gate structure 140, in order to insulate the main structure of semiconductor device 110 from the external connection. The interlayer dielectric layer can be etched to obtain a first etching hole and a second etching hole. The first etching hole can connect to the metal silicide layer, and the second etching hole can connect to the drift region.

That is, the first and second etching holes may be formed on the position of drift region 230 between two field oxide layers 150. The position of the second etching hole may not be limited to the drift region 230 between two field oxide layers 150, and the position of the second etching hole may be located on field oxide layers 150 by etching two field oxide layers 150, which can reduce the alignment requirement of field oxide layer 150. A conductive material can be deposited in the first and second etching holes, in order to obtain a drain electrode that can include first and second conductive pillars. For example, the deposited conductive material can include titanium, titanium nitride, and tungsten, in order to form the first and second conductive pillars of the drain electrode. For example, the step of depositing conductive material can include first depositing titanium with a thickness from 200 angstroms to 400 angstroms, then depositing titanium nitride with a thickness from 50 angstroms to 100 angstroms, and finally depositing tungsten.

In particular embodiments, the semiconductor device can include a second conductive pillar, and in some embodiments, the semiconductor device can include two or more second conductive pillars, which may be located at both sides of the first conductive pillar, respectively, in the equivalent structure of two transistors sharing the drain electrode. For example, metal electrodes 102, 103, and 104 can be formed according to the requirements of corresponding source electrode and gate electrode.

In particular embodiments, the semiconductor device and its manufacturing method can include the integrated structure of two transistors sharing the drain electrode, while omitting the drain doped region. Also, the effective extraction of the drain electrode can be realized by using the second conductive pillar directly connected to the drift region. The occupation demand of the drain doped region on the lateral size of the semiconductor device can be reduced as a result, which can reduce of the lateral size of the semiconductor device. It can be understood that a single transistor with a single source, drain, and gate structure can also be applied to the electrode structure and the example manufacturing method, which can reduce the lateral size of a single laterally arranged transistor.

The drain electrode of the semiconductor device can include first and second conductive pillars. The first conductive pillar can connect to the metal silicide layer, the drift region can connect to the first conductive pillar through the metal silicide layer, and the second conductive pillar can directly connect to the drift region. The drain electrode may be led out when there is no drain doped region in the drift region, which can reduce the occupation of the drain doped region on the lateral size of the semiconductor device, thus facilitating reduction of the lateral size of semiconductor device. Furthermore, controlling the thickness of the titanium layer and titanium nitride layer of the metal pad layer at the bottom of the first and second conductive pillars can be controlled to give consideration to the extraction resistance of the first and second conductive pillars. As a result, the electrical performance of the drain electrode may be improved, and effective extraction of the drain electrode substantially ensured.

In particular embodiments, the manufacturing method of the semiconductor device can include forming a metal pad layer on the drift region, forming the first etch hole and the second etch hole connected to the metal pad layer and the drift region respectively, and depositing conductive material in the first etching hole and the second etching hole to form the first conductive pillar and the second conductive pillar of the drain electrode. The drain doped region for leading out the drain electrode can omitted, and occupation of the drain doped region on the lateral size of the drift region may be reduced, thus facilitating reduction of the lateral size of semiconductor device. The first and second conductive pillars may have the same structure, which can facilitate simultaneous formation, and also and reduce associated process costs.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A semiconductor device, comprising:
a) a semiconductor doped region;
   an electrode structure connected to the semiconductor doped region through opening holes of an interlayer dielectric layer;
c) a patterned metal silicide layer located on the semiconductor doped region;
d) wherein the electrode structure comprises a first conductive pillar and a second conductive pillar, the first conductive pillar is directly connected to the metal silicide layer, and the second conductive pillar is directly connected to an upper surface of the semiconductor doped region; and
e) wherein the first conductive pillar and the second conductive pillar are not in contact with a heavily doped region other than the semiconductor doped region, and the doping concentration of the semiconductor doped region is not greater than $10^{18}$ cm$^{-3}$.

2. The semiconductor device of claim 1, wherein the first conductive pillar and the second conductive pillar each have same structure comprising a pad layer and a conductive column arranged on the pad layer.

3. The semiconductor device of claim 2, wherein the pad layer comprises a titanium layer and a titanium nitride layer arranged on the titanium layer.

4. The semiconductor device of claim 3, wherein a thickness of the titanium layer ranges from 200 angstroms to 400 angstroms.

5. The semiconductor device of claim 3, wherein a thickness of the titanium nitride layer ranges from 50 angstroms to 100 angstroms.

6. The semiconductor device of claim 2, wherein the conductive column comprises a tungsten conductive pillar.

7. The semiconductor device of claim 1, wherein the first conductive pillar and the second conductive pillar are configured to be connected in parallel after being led out.

8. The semiconductor device of claim 1, further comprising:
a) a semiconductor substrate;
b) a first body region extending from an upper surface of the semiconductor substrate to inside of the semiconductor substrate;
c) wherein the semiconductor doped region comprises a drift region extending from the upper surface of the semiconductor substrate to inside of the semiconductor substrate;
d) a first source doping region extending from an upper surface of the first body region to inside of the first body region;
e) a first gate structure located on the upper surface of the semiconductor substrate and extending from over the first source doped region to over the drift region; and
f wherein the semiconductor doped region is configured as the drift region.

9. The semiconductor device of claim 8, further comprising:
a) a second body region extending from an upper surface of the semiconductor substrate to inside of the semiconductor substrate;
b) a second source doping region extending from an upper surface of the second body region to inside of the second body region;
c) a second gate structure located on the semiconductor substrate and extending from over the second source doped region to over the drift region; and
wherein the second body region and the first body region are respectively located on both sides of the drift region.

10. The semiconductor device of claim 1, wherein a resistance of the first conductive pillar is less than a resistance of the second conductive pillar.

11. The semiconductor device of claim 1, wherein the semiconductor doped region comprises a drift region that has no drain doped regions therein.

* * * * *